(12) United States Patent
Guo

(10) Patent No.: US 12,211,547 B2
(45) Date of Patent: Jan. 28, 2025

(54) DUMMY DATA-BASED READ REFERENCE VOLTAGE SEARCH OF NAND MEMORY

(71) Applicant: Yangtze Memory Technologies Co., Ltd., Hubei (CN)

(72) Inventor: Lu Guo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 175 days.

(21) Appl. No.: 18/162,742

(22) Filed: Feb. 1, 2023

(65) Prior Publication Data

US 2024/0233813 A1    Jul. 11, 2024

Related U.S. Application Data

(63) Continuation of application No. PCT/CN2023/071275, filed on Jan. 9, 2023.

(51) Int. Cl.
*G11C 11/408* (2006.01)
*G11C 11/4096* (2006.01)
*G11C 11/4099* (2006.01)

(52) U.S. Cl.
CPC ...... *G11C 11/4099* (2013.01); *G11C 11/4085* (2013.01); *G11C 11/4096* (2013.01)

(58) Field of Classification Search
CPC ............ G11C 11/4099; G11C 11/4085; G11C 11/4096

(Continued)

(56) References Cited

U.S. PATENT DOCUMENTS

| 8,351,258 B1 | 1/2013 | Yang et al. |
| 8,416,623 B2 | 4/2013 | Yang |

(Continued)

FOREIGN PATENT DOCUMENTS

| CN | 111192620 A | 5/2020 |
| CN | 111105835 B | 3/2022 |
| TW | I708248 B | 10/2020 |

OTHER PUBLICATIONS

International Search Report issued on Jun. 23, 2023 in the corresponding International Application No. PCT/CN2023/071275, 3 pages.

(Continued)

*Primary Examiner* — Ly D Pham
(74) *Attorney, Agent, or Firm* — Oblon, McClelland, Maier & Neustadt, L.L.P.

(57) ABSTRACT

A method can include performing a single-read operation at a read reference voltage to detect bits from memory cells. Dummy data is previously programmed into the memory cells. Original bits of the memory cells can be determined based on a default read reference voltage and known values of the dummy data. The detected bits and the original bits are compared to determine an upper-state failed bit count (FBC) corresponding to the memory cells having threshold voltages shifted from above the read reference voltage to below the read reference voltage and a lower-state FBC corresponding to the memory cells having threshold voltages shifted from below the read reference voltage to above the read reference voltage. When a difference between the upper-state FBC and the lower-state FBC being smaller than a threshold, the read reference voltage can be determined to be a best read reference voltage.

20 Claims, 12 Drawing Sheets

(58) Field of Classification Search
USPC .................................................. 365/185.2
See application file for complete search history.

(56) References Cited

U.S. PATENT DOCUMENTS

| | | | | |
|---|---|---|---|---|
| 2016/0172029 | A1* | 6/2016 | Kern | G11C 7/04 |
| | | | | 365/158 |
| 2020/0409788 | A1* | 12/2020 | Kurose | G11C 16/0483 |
| 2021/0335418 | A1* | 10/2021 | Yanagidaira | G11C 16/32 |
| 2021/0357289 | A1* | 11/2021 | Kurose | G11C 29/46 |
| 2024/0194248 | A1* | 6/2024 | Duan | G11C 11/4085 |

OTHER PUBLICATIONS

Micron Technology, Inc. "An Introduction to NAND Flash and How to Design IT In to Your Next Product", TN-29-19: NAND Flash 101, Dec. 31, 2019, 27 pages.

Office Action and Search Report issued on Apr. 19, 2024 in the corresponding Taiwanese Patent Application No. 112125582 (with Translation of Category of Cited Documents), 17 pages.

* cited by examiner

| String | Page | 1st 4k | 2nd 4k | 3rd 4k | 4th 4K |
|---|---|---|---|---|---|
| 0 | 0 | LBA-0 | LBA-1 | LBA-2 | LBA-3 |
| 0 | 1 | LBA-4 | LBA-5 | LBA-6 | LBA-7 |
| 0 | 2 | LBA-8 | LBA-9 | LBA-10 | LBA-11 |
| 1 | 3 | LBA-12 | LBA-13 | LBA-14 | DUMMY |
| 1 | 4 | LBA-16 | LBA-17 | LBA-18 | DUMMY |
| 1 | 5 | LBA-20 | LBA-21 | LBA-22 | DUMMY |
| 2 | 6 | LBA-15 | LBA-16 | LBA-17 | LBA-18 |
| 2 | 7 | LBA-19 | LBA-20 | LBA-21 | LBA-22 |
| 2 | 8 | LBA-23 | LBA-24 | LBA-25 | LBA-26 |
| 3 | 9 | LBA-27 | LBA-28 | LBA-29 | LBA-30 |
| 3 | 10 | LBA-31 | LBA-32 | LBA-33 | LBA-34 |
| 3 | 11 | LBA-35 | LBA-36 | LBA-37 | LBA-38 |
| 4 | 12 | DUMMY | DUMMY | DUMMY | DUMMY |
| 4 | 13 | DUMMY | DUMMY | DUMMY | DUMMY |
| 4 | 14 | DUMMY | DUMMY | LBA-40 | DUMMY |
| 5 | 15 | LBA-39 | LBA-40 | LBA-41 | LBA-42 |
| 5 | 16 | LBA-43 | LBA-44 | LBA-45 | LBA-46 |
| 5 | 17 | LBA-47 | LBA-48 | LBA-49 | LBA-50 |

FIG. 10

DUMMY DATA-BASED READ REFERENCE VOLTAGE SEARCH OF NAND MEMORY

INCORPORATION BY REFERENCE

The present application is a bypass continuation application of International Application No. PCT/CN2023/071275, filed Jan. 9, 2023, which is incorporated by reference herein in its entirety.

TECHNICAL FIELD

The present application is related to three-dimensional (3D) NAND flash memory operation techniques.

BACKGROUND

Three-dimensional (3D) NAND flash memory employs advanced multi-level cell (MLC) techniques to provide high storage density. The read-retry mechanism is used to improve the reliability of 3D NAND flash memory. For example, multiple retry steps with adjusted read reference voltage values can be performed to read a target page multiple times before an encoded page can be correctly decoded. A large number of read-retry operations can significantly increase the read latency and degrade the performance of a memory system.

SUMMARY

Aspects of the disclosure provide a method. The method can include performing a single-read operation at a read reference voltage of a first level to detect bits from a set of memory cells in a memory device. Dummy data is previously programmed into the set of memory cells. Original bits of the set of memory cells can be determined based on a default read reference voltage and known values of the dummy data. The original bits correspond to initial threshold voltages of the set of memory cells when the dummy data is initially programmed into the set of memory cells. The detected bits and the original bits are compared to determine an upper-state failed bit count (FBC) and a lower-state FBC. The upper-state FBC is a first number of flipping bits that correspond to the memory cells having threshold voltages shifted from above the read reference voltage to below the read reference voltage. The lower-state FBC is a second number of flipping bits that correspond to the memory cells having threshold voltages shifted from below the read reference voltage to above the read reference voltage. In response to a difference between the upper-state FBC and the lower-state FBC being smaller than a threshold, the read reference voltage of the first level can be determined to be a best read reference voltage.

An embodiment of the method can further include, in response to the difference between the upper-state FBC and the lower-state FBC being larger than the threshold, and the lower-state FBC being smaller than the upper-state FBC, performing the steps of the performing, the determining, and the comparing using the read reference voltage of a second level smaller than the first level. An embodiment of the method can further include, in response to the difference between the upper-state FBC and the lower-state FBC being larger than the threshold, and the lower-state FBC being larger than the upper-state FBC, performing the steps of the performing, the determining, and the comparing using the read reference voltage of a third level larger than the first level.

In an embodiment, the read reference voltage is increased or decreased based on a fixed step voltage. In an embodiment, in response to the difference between the upper-state FBC and the lower-state FBC being outside of a predefined range, the read reference voltage is increased or decreased based on a first step voltage. In response to the difference between the upper-state FBC and the lower-state FBC being inside of the predefined range, the read reference voltage is increased or decreased based on a second step voltage smaller than the first step voltage.

In an embodiment, the method is performed as a background operation. In an embodiment, the method is triggered in response to a host read request, and the best read reference voltage is used as an initial read reference voltage for reading data from the memory device. In an embodiment, the method is triggered after an error correction code (ECC) decoding fails. For example, the best read reference voltage can be used as a read-retry voltage for reading data from the memory device, or a base voltage for a soft decode process for reading data from the memory device.

In an embodiment, in response to a failure of an ECC decoding for reading a current page, one of the following can be determined: the current page including the dummy data, a neighboring page of the current page including the dummy data, a word line group that includes the current page including the dummy data, and the current page belonging to a super page that includes the dummy data in a plane or a die different from a plane or a die of the current page. Accordingly, the best read voltage can be used as a reference voltage for reading the current page.

In an embodiment, the dummy data is one of data of codewords that belong to multiple pages that are stored in a horizontal memory cell string including memory cells associated with a word line, and data of multiple pages that are stored in a horizontal memory cell string including memory cells associated with a word line.

An embodiment of the method can include determining a block in the memory device to be a weak block that is more vulnerable to flipping bit errors than another block in the memory device, and writing the dummy data to the block. An embodiment of the method can include using the best read voltage as a reference read voltage for one of reading a code word stored in a same page as the dummy data, reading a page neighboring a page including the dummy data, reading a page belonging to a word line group that includes the dummy data, reading a page that belongs to a same super page as the dummy data and is stored in a plane or die different from a plan or die where the dummy data is stored.

In an embodiment, the method is performed by a solid-state drive (SSD) controller. In an embodiment, the method is performed by circuitry in the memory device. In an embodiment, the memory device is a three-dimensional (3D) NAND memory device.

Aspects of the disclosure provide a non-transitory computer-readable medium storing instructions. The instructions, when executed by a processor, cause the processor to perform the method.

Aspects of the disclosure provide a memory controller including circuitry. The circuitry is configured to perform a single-read operation at a read reference voltage of a first level to detect bits from a set of memory cells in a memory device. Dummy data is previously programmed into the set of memory cells. Original bits of the set of memory cells can be determined based on a default read reference voltage and known values of the dummy data. The original bits correspond to initial threshold voltages of the set of memory cells when the dummy data is initially programmed into the set of memory cells. The detected bits and the original bits are compared to determine an upper-state FBC and a lower-state FBC. The upper-state FBC is a first number of flipping bits that correspond to the memory cells having threshold voltages shifted from above the read reference voltage to below the read reference voltage. The lower-state FBC is a second number of flipping bits that correspond to the memory cells having threshold voltages shifted from below the read reference voltage to above the read reference voltage. In response to a difference between the upper-state FBC and the lower-state FBC being smaller than a threshold, the read reference voltage of the first level can be determined to be a best read reference voltage.

Aspects of the disclosure provide a memory system. The memory system can include a memory device, and a memory controller. The memory controller is configured to perform a single-read operation at a read reference voltage of a first level to detect bits from a set of memory cells in the memory device. Dummy data is previously programmed into the set of memory cells. Original bits of the set of memory cells can be determined based on a default read reference voltage and known values of the dummy data. The original bits correspond to initial threshold voltages of the set of memory cells when the dummy data is initially programmed into the set of memory cells. The detected bits and the original bits are compared to determine an upper-state FBC and a lower-state FBC. The upper-state FBC is a first number of flipping bits that correspond to the memory cells having threshold voltages shifted from above the read reference voltage to below the read reference voltage. The lower-state FBC is a second number of flipping bits that correspond to the memory cells having threshold voltages shifted from below the read reference voltage to above the read reference voltage. In response to a difference between the upper-state FBC and the lower-state FBC being smaller than a threshold, the read reference voltage of the first level can be determined to be a best read reference voltage.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

FIG. 10 shows examples of dummy data programmed in a memory device according to embodiments of the disclosure.

DETAILED DESCRIPTION OF EMBODIMENTS

Figure 1:
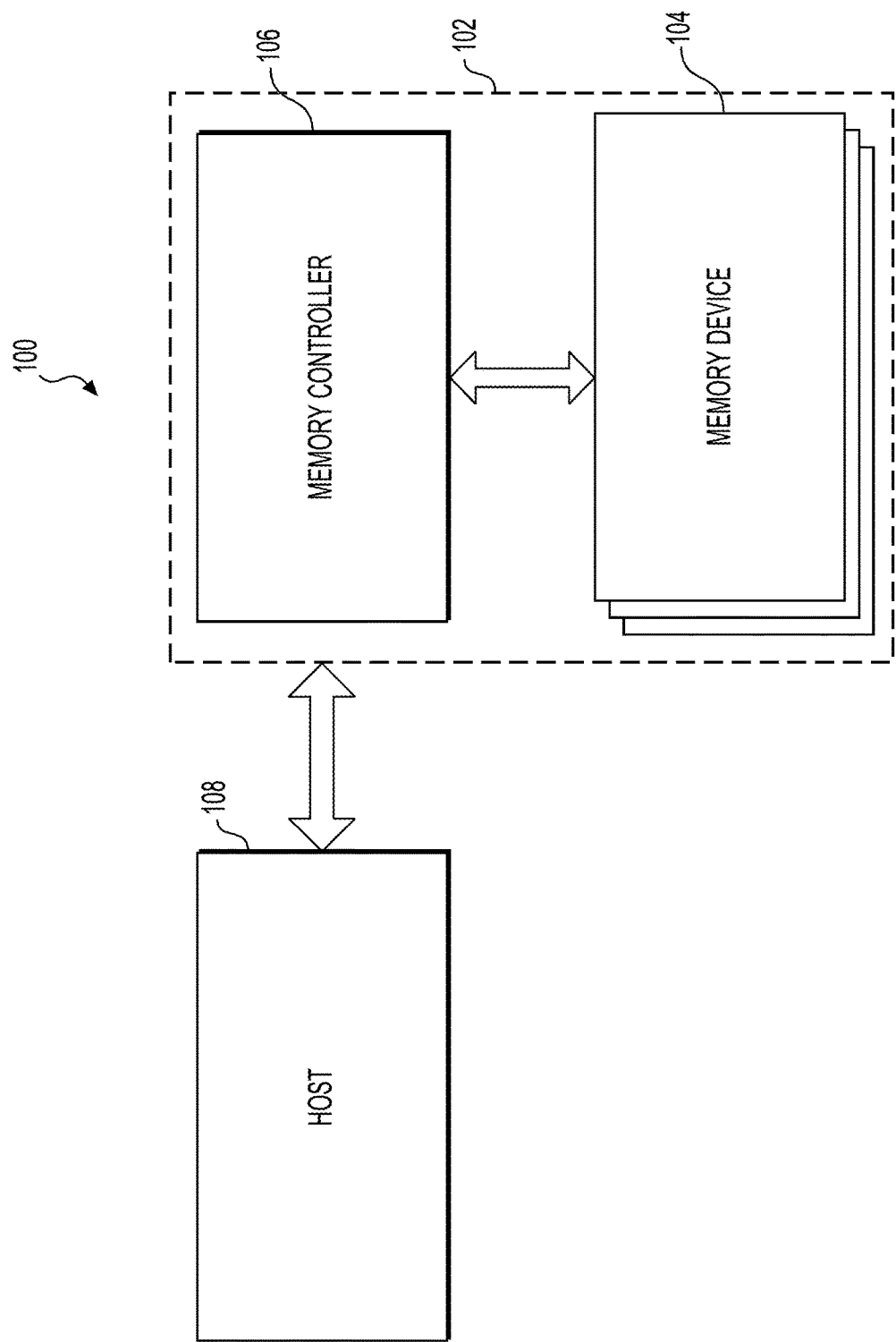
FIG. 1 illustrates a block diagram of a system 100 having a memory device according to some aspects of the present disclosure.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is not limited to three-dimensional (3D) NAND memory devices, although 3D NAND devices may be used in some examples to illustrate inventive concepts. For example, the techniques disclosed herein can be applied to planar NAND memory devices. In addition, the methods and techniques disclosed herein are not limited to memory devices based on multiple-level cell (MLC) techniques, although MLC devices are used in some examples to illustrate inventive concepts. For example, the methods and techniques can also be applied to memory devices based on single-level cell (SLC) techniques.

Aspects of the disclosure provide a dummy-data-based best read reference voltage search method. For example, dummy data including known bits can be stored in a set of memory cells in a three-dimensional (3D) NAND memory device. Initial states (threshold voltage levels) of these memory cells are known accordingly. For example, with respect to a default read reference voltage, a memory cell is either in state 1 (threshold voltage level being smaller than the default read reference voltage) or state 0 (threshold voltage level being larger than the default read reference voltage).

The states of these memory cells can shift after a period of retention time. To find a best read reference voltage, multiple single-read operations on these memory cells can be performed at different read reference voltages in a scan process. The scan process covers a voltage range around a target default read reference voltage. For each single-read operation, these memory cells can be detected to be in state 1 or state 0 with respect to the respective read reference voltage level.

Comparing the detected states (or detected bits) with the initial states of the memory cells with respect to the target read reference voltage, flipping bits can be identified among the memory cells. A number of the flipping bits flipped from 0 to 1 are referred to an upper-state failed bit count (FBC), while a number of the flipping bits flipped from 1 to 0 are referred to a lower-state failed bit count (FBC). A read reference voltage within the scanned voltage range that can minimize the difference between the upper-state FBC and the lower-state FBC can be determined to be the best read reference voltage (best read level). The best read reference voltage can be used in a read retry process for reading regular data stored in a region near the region where the dummy data is stored FIG. 1 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. Memory device 104 can be any memory device disclosed in the present disclosure.

Memory controller 106 is coupled to memory device(s) 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment like solid state drives (SSDs) or embedded multi-media-cards (eMMCs) used as data storage for mobile devices, such as smartphones, tablets, laptop computers, etc., and enterprise storage arrays. In various embodiments, the memory controller 106 can be implemented with hardware (such as circuitry) or can be implemented with a combination of hardware (such as a processor including processing circuitry) and software (such as instructions stored in a non-transitory computer-readable medium.

Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Consistent with some aspects of the present disclosure, in some implementations, memory controller 106 is configured to fully or partially perform the dummy-data-based best read reference voltage search method, as described below in detail.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products.

Figure 2A:
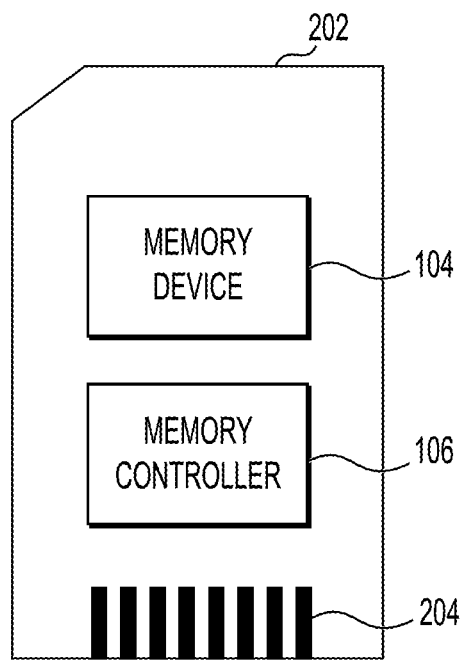
FIGS. 2A-2B show two examples of memory systems according to some aspects of the present disclosure.
Figure 2B:
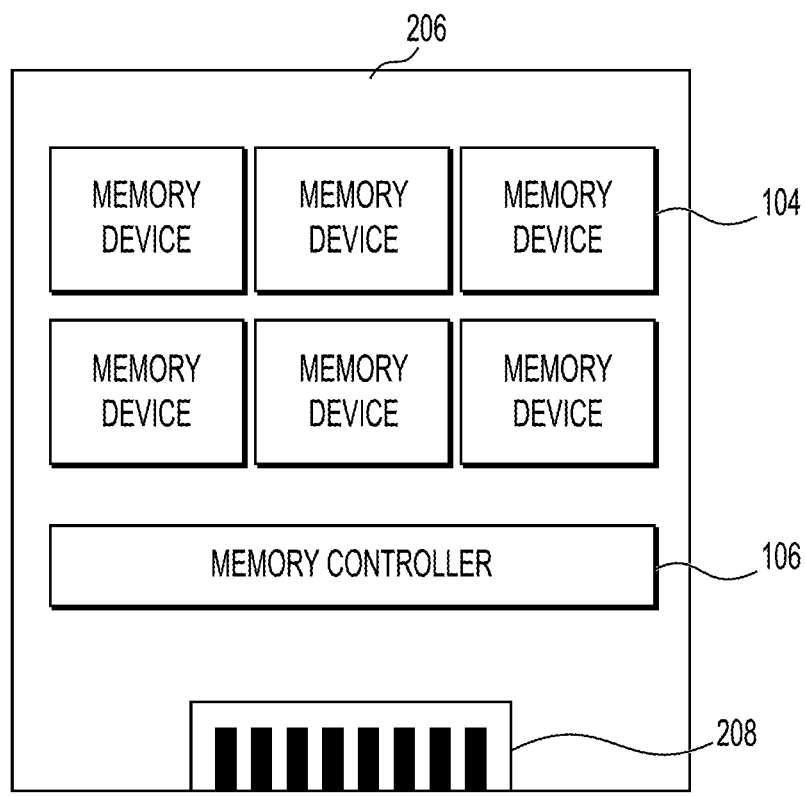

In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
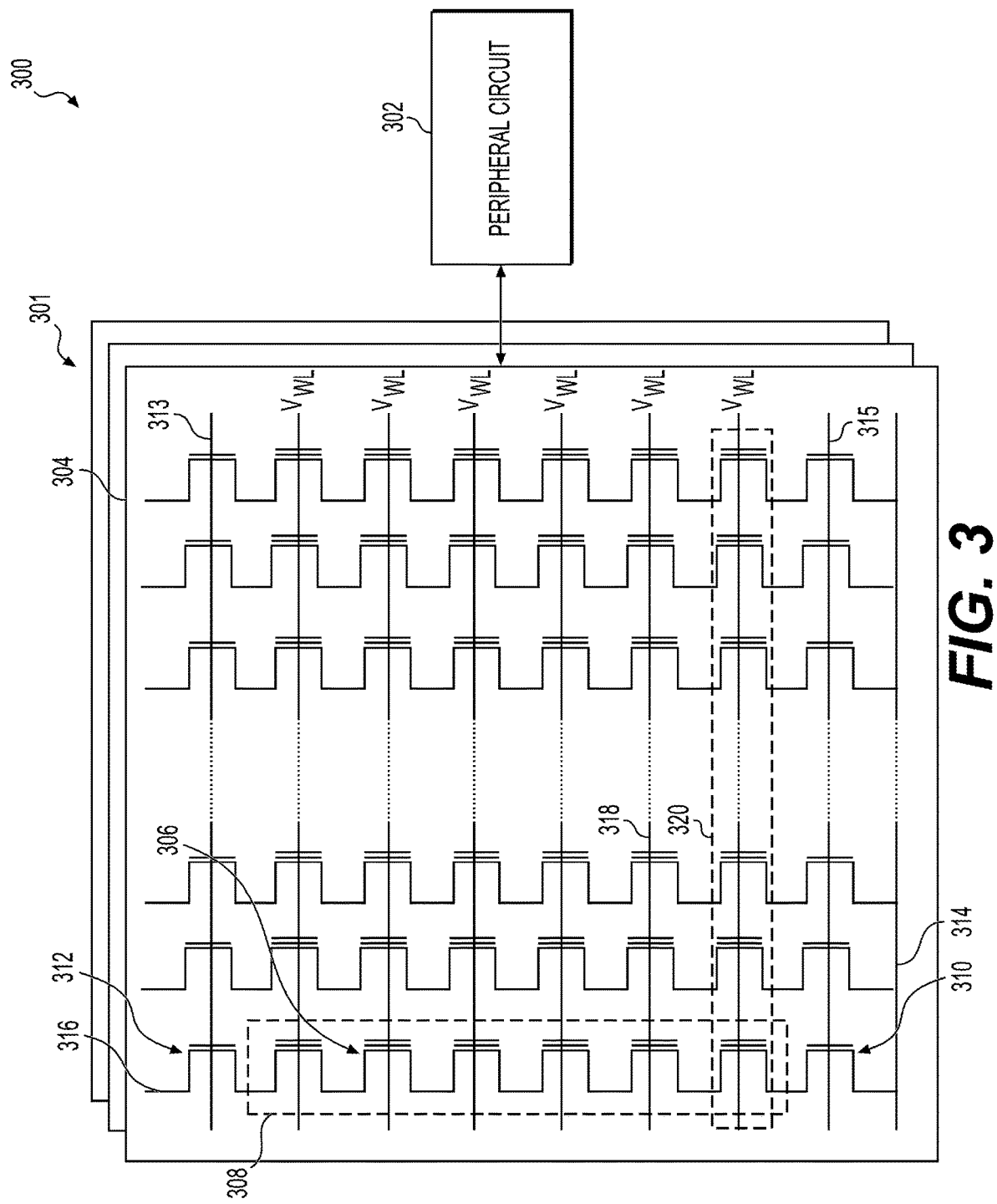
FIG. 3 illustrates a schematic circuit diagram of a memory device 300 including peripheral circuits according to some aspects of the present disclosure.

FIG. 3 illustrates a schematic circuit diagram of a memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell (also known as double-level cell (DLC)), three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, the sources of NAND memory strings 308 in a same block 304 are coupled through a same source line (SL) 314, e.g., a common SL. In other words, all NAND memory strings 308 in the same block 304 have an array common source (ACS), according to some implementations. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block.

Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. For ease of description, memory cells 306 in one page 320 may be coupled to a same word line 318, and the terms "page" and "word line" may be used interchangeably in the present disclosure. It is understood that, however, in some examples, memory cells 306 in one page 320 may be coupled to more than one word lines 318. Each word line 318 can include a plurality of control gates (gate electrodes) at each memory cell 306 in respective page 320 and a gate line coupling the control gates. In some implementations, each word line 318 can be coupled to multiple pages (or partial pages) of memory cells based on the control of SSGs and DSGs.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies.

Figure 4:
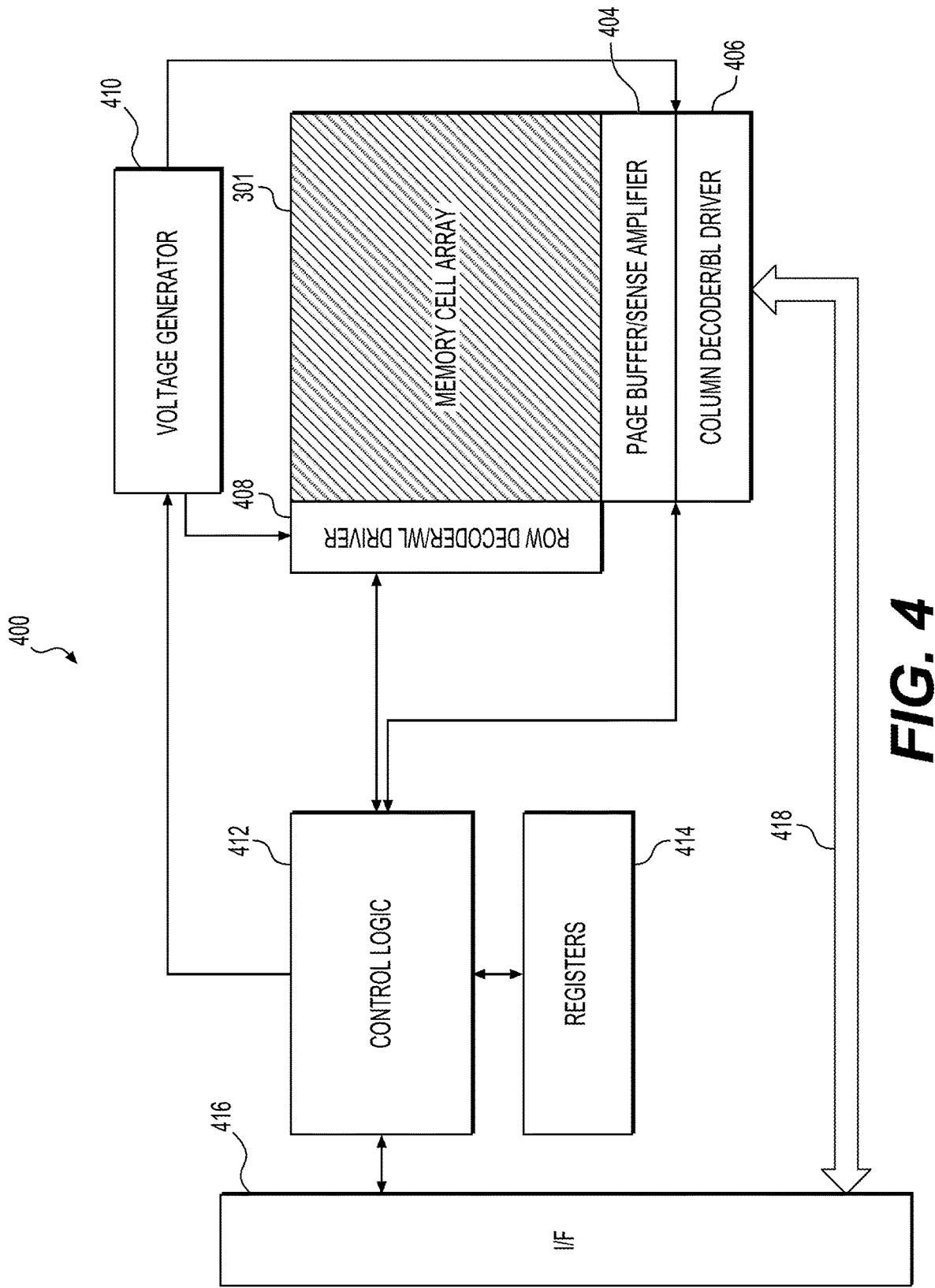
FIG. 4 illustrates examples of peripheral circuits according to some aspects of the present disclosure.

For example, FIG. 4 illustrates some peripheral circuits including a page buffer/sense amplifier 404, a column decoder/bit line driver 406, a row decoder/word line driver 408, a voltage generator 410, control logic 412, registers 414, an interface 416, and a data bus 418. It is understood that in some examples, additional peripheral circuits not shown in FIG. 4 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in a read operation. Column decoder/bit line driver 406 can be configured to be controlled by control logic 412 and select one or more NAND memory strings 308 by applying bit line voltages generated from voltage generator 410.

Row decoder/word line driver 408 can be configured to be controlled by control logic 412 and select/deselect blocks 304 of memory cell array 301 and select/deselect word lines 318 of block 304. Row decoder/word line driver 408 can be further configured to drive word lines 318 using word line voltages generated from voltage generator 410. In some implementations, row decoder/word line driver 408 can also select/deselect and drive SSG lines 315 and DSG lines 313 as well. As described below in detail, row decoder/word line driver 408 is configured to apply a read voltage to selected word line 318 in a read operation on memory cell 306 coupled to selected word line 318. The read voltage can be either the compensated read voltage with the open block-based read offset when the read voltage is applied to word line 318 in an open block or the default read voltage without the open block-based read offset when the read voltage is applied to word line 318 in a full block.

Voltage generator 410 can be configured to be controlled by control logic 412 and generate the word line voltages (e.g., read voltage, program voltage, pass voltage, local voltage, verification voltage, etc.), bit line voltages, and source line voltages to be supplied to memory cell array 301. As described below in detail, depending on whether the read operation is performed in an open block or a full block, control logic 412 can control voltage generator 410 to provide either a default read voltage or a compensated read voltage having an offset from the default read voltage to row decoder/word line driver 408.

Control logic 412 can be coupled to each peripheral circuit described above and configured to control operations of each peripheral circuit. Registers 414 can be coupled to control logic 412 and include status registers, command registers, and address registers for storing status information, command operation codes (OP codes), and command addresses for controlling the operations of each peripheral circuit. As described below in detail, the status registers of registers 414 can include one or more registers configured to store open block information indicative of the open block(s) of all blocks 304 in memory cell array 301, such as having an ADSV list. In some implementations, the open block information is also indicative of the last programmed page of each open block.

Figure 5:
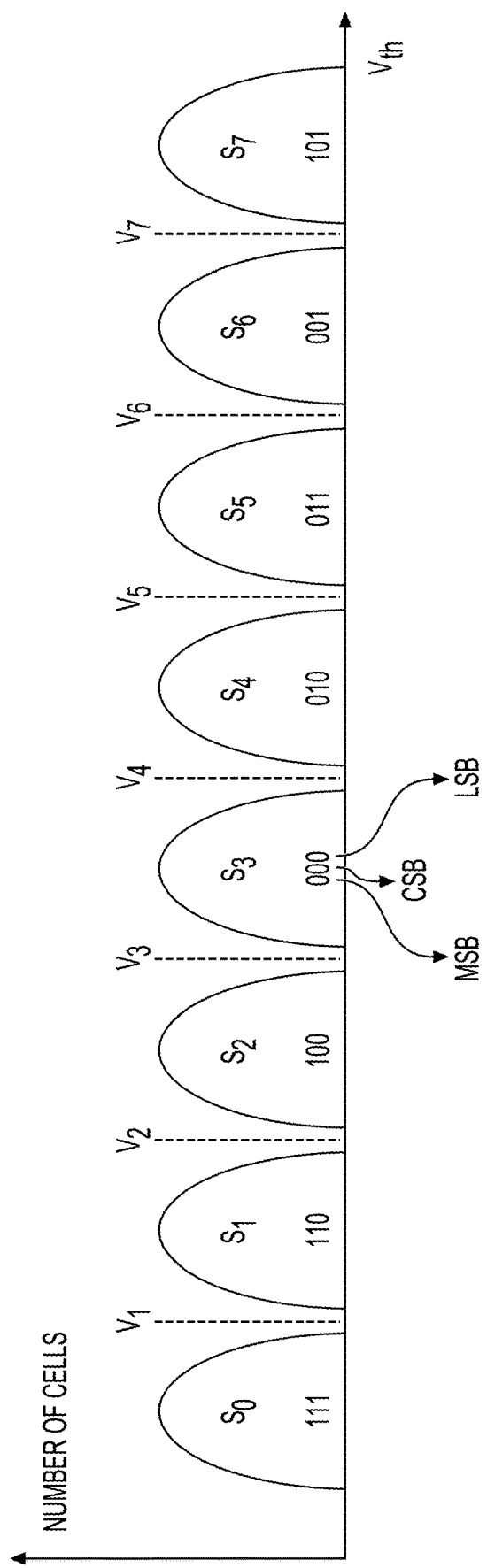
FIG. 5 shows a schematic diagram of threshold voltage distributions of memory cells according to embodiments of the disclosure.

FIG. 5 shows a schematic diagram of threshold voltage distributions of memory cells according to embodiments of the disclosure. The horizontal axis represents threshold voltages (denoted Vth) of the memory cells. The vertical axis represents numbers of the memory cells corresponding to different threshold voltages.

In FIG. 5, the memory cells can be memory cells in a 3D NAND memory device corresponding to a page, a codeword, a horizontal memory cell string, a block, a plane, a die, and the like. The memory cells are TLCs and can be programmed (or erased) to be in one of 8 states, denoted from S0 to S7. Each of the states can also be referred to as a level, denoted from L0 to L7. Memory cells programmed (or erased) to be in a specific state can have threshold voltages distributed within a voltage range. Accordingly, in FIG. 5, each state (from S0 to S7) is shown to have a threshold voltage distribution. In some examples, these distributions can each be modeled using Poisson distribution.

A memory cell, depending on which state or level the memory cell is in, can represent three bits. In other words, three bits can be encoded in one of the 8 states. The mapping between the states and the respective three bits can vary in different embodiments. In FIG. 5, the 8 states from S0 to S7 are mapped to 111, 110, 100, 000, 010, 011, 001, and 101, respectively. Least significant bits (LSBs) of the 3-digit bits can belong to a lower page. Center significant bits (CSBs) of the 3-digit bits can belong to a middle page. Most significant bits (MSBs) of the 3-digit bits can belong to an upper page.

In FIG. 5, seven default read reference voltages from V1 to V7 are positioned between the respective memory cell threshold voltage distributions. Ideally, each memory cell threshold voltage distribution can be contained within two neighboring default read reference voltages. In other words, it is desired that a programmed or erased memory cell can keep an intended state thus maintaining the three bits represented. However, the memory cell threshold distribution may shift or expand from one distribution to another distribution, due to, for example, program/erase (P/E) cycle, retention age, write or read disturbance, temperature variance, and the like. Such a change of the memory cell threshold distribution causes read errors.

Corresponding to a certain default read reference voltage, if a memory cell has a threshold voltage below the default read reference voltage, the memory cell is said to be in a lower state. If a memory cell has a threshold voltage above the default read reference voltage, the memory cell is said to be in an upper state. Also, in FIG. 5, a state to the right side of the default read reference voltage is called an upper state with respect to the default read reference voltage. A state to the left side of the default read reference voltage is called a lower state with respect to the default read reference voltage.

Corresponding to different MLC techniques, different sets of one or more default read reference voltages can be used. For example, SLCs can use one default read reference voltage to distinguish two states. DLCs can use three default read reference voltages to distinguish four states. QLCs can use 15 default read reference voltages to distinguish 16 states.

Figure 6:
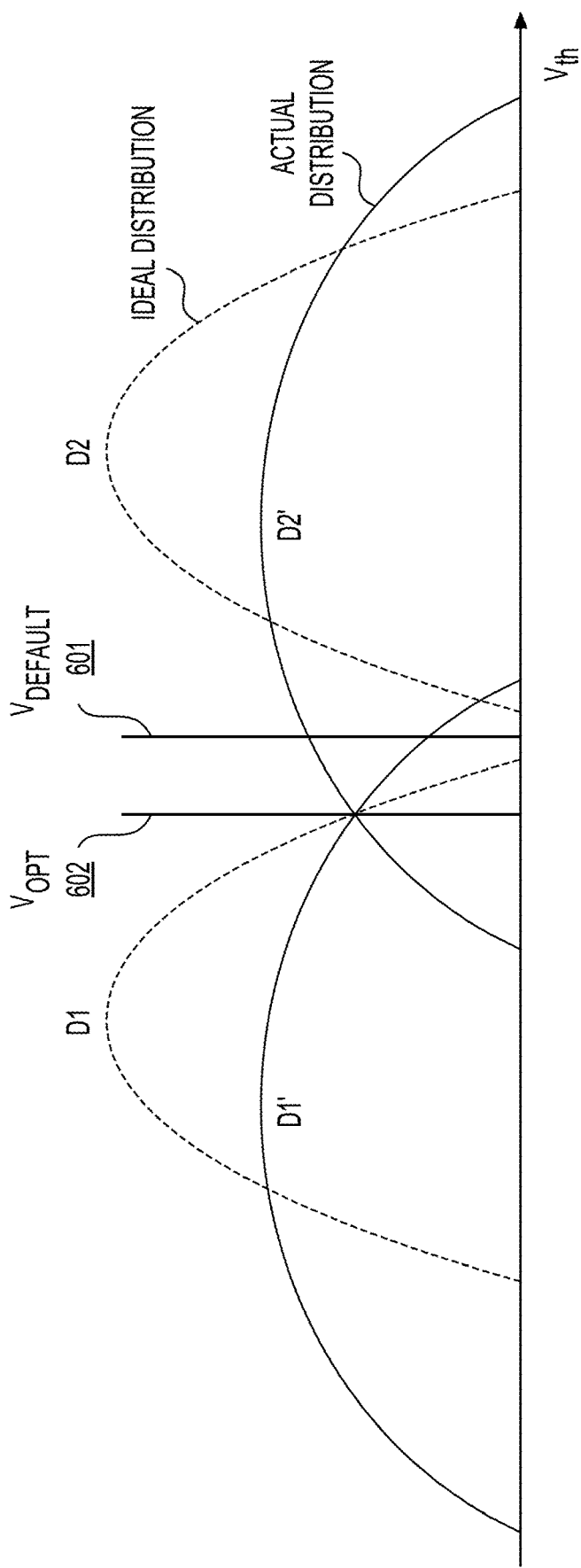
FIG. 6 shows a scenario where memory cell threshold voltage distributions have shifted.

FIG. 6 shows a scenario where memory cell threshold voltage distributions have shifted. Distributions D1 and D2 (dashed lines) represent ideal memory cell threshold voltage distributions corresponding to two neighboring states (such as S1 and S2 in FIG. 5). When threshold voltages of memory cells are each set to be within a target voltage range after being programmed and thus the states of the memory cells are each set to be a target state, the memory cell threshold voltage distributions of these memory cells are referred to as ideal memory cell threshold voltage distributions. A default read reference voltage 601, denoted $V_{default}$, is positioned between the Distribution D1 and the Distribution D2. Corresponding to the ideal threshold voltage distributions, the memory cells are in the states that exactly represent or map with encoded bits of data programmed into the memory cells. Typically, states of memory cells at the time of the memory cells being programmed can be in an ideal distribution. In other words, memory cells at the time of being programmed can have an ideal threshold voltage (or state) distribution.

Corresponding to Distributions D1 and D2, when a single-read operation is performed using the default read reference voltage 601, memory cells belonging to Distribution D2 are detected to be, for example, in a status of 0 (indicating having a threshold voltage larger than $V_{defualt}$), resulting in bits of 0. Memory cells belonging to Distribution D1 are detected to be, for example, in a status of 1 (indicating having a threshold voltage lower than $V_{defualt}$), resulting in bits of 1. Those detected bits correspond to ideal threshold voltage distributions or the states of the memory cells at the time of being programmed. Thus, those bits are referred to as original bits or ideal bits with respect to the corresponding default read reference voltage 601. It is noted that, when data programmed into a set of memory cells are known, ideal states of the set of memory cells (e.g., states S0-S7 in FIG. 5) can be determined based on the data without any read operations. Thus, original bits can be derived or calculated if the associated data is known. Accordingly, original bits can also be used to refer to derived bits or calculated bits in the context of determining error bits based on known data.

In comparison with a page read operation where multiple read operations occur at multiple different read reference voltages, a read operation at a single-read reference voltage (such as a default or non-default read reference voltage) is referred to as a single-read operation.

Distribution D1' and D2' represent actual memory cell threshold voltage distributions as a result of the ideal Distributions D1 and D2 having shifted. Under the actual distributions, when a single-read operation is performed using the default read reference voltage 601, memory cells belonging to Distribution D2' but each having a threshold value smaller than $V_{default}$ would be detected to be, for example, in a status of 1 (indicating having a threshold voltage smaller than $V_{defualt}$), resulting in bits of 1. Thus, the original bits 0 represented by these memory cells have flipped to be 1. These flipping bits are referred to as upper-state flipping bits as the respective memory cells have changed the status from an upper state to a lower state.

Memory cells belonging to Distribution D1' but each having a threshold value larger than $V_{default}$ would be detected to be, for example, in a status of 0 (indicating having a threshold voltage larger than $V_{defualt}$), resulting in bits 0. Thus, the original bits 1 represented by these memory cells have flipped to be 0. These flipping bits are referred to as lower-state flipping bits as the respective memory cells have changed the status from a lower state to an upper state.

Besides the memory cells associated with the lower-state or upper-state flipping bits, other memory cells belonging to Distributions D1' and D2' can still be correctly detected to be in status 1 and 0, respectively.

During a page read operation (including multiple single-read operations), flipping bit errors from the multiple single-read operations can lead to bit errors in code words of a page. When a raw bit error rate (RBER) of a code word reaches a level beyond ECC correction capability, related data (for example, corresponding to a page) cannot be recovered, leading to an ECC decoding failure. To achieve a successful ECC correction, it is desirable to reduce the number of flipping bits in a single-read operation.

The present disclosure provides techniques and methods for searching for a best read reference voltage to minimize or reduce the number of flipping bits. FIG. 6 shows an optimal read reference voltage 602, denoted $V_{opt}$. The optimal read reference voltage 602 can be a read reference voltage where the amount of flipping bits (including flipping from 1 to 0 or from 0 to 1) is minimum compared with other read reference voltages within a search range 610. A best read reference voltage 603 can be an output of a search process and is close to the optimal read reference voltage 602. The mismatch between the best read reference voltage 603 and the optimal read reference voltage 602 can be limited to be within a precision as set in the respective search process.

Figure 7:
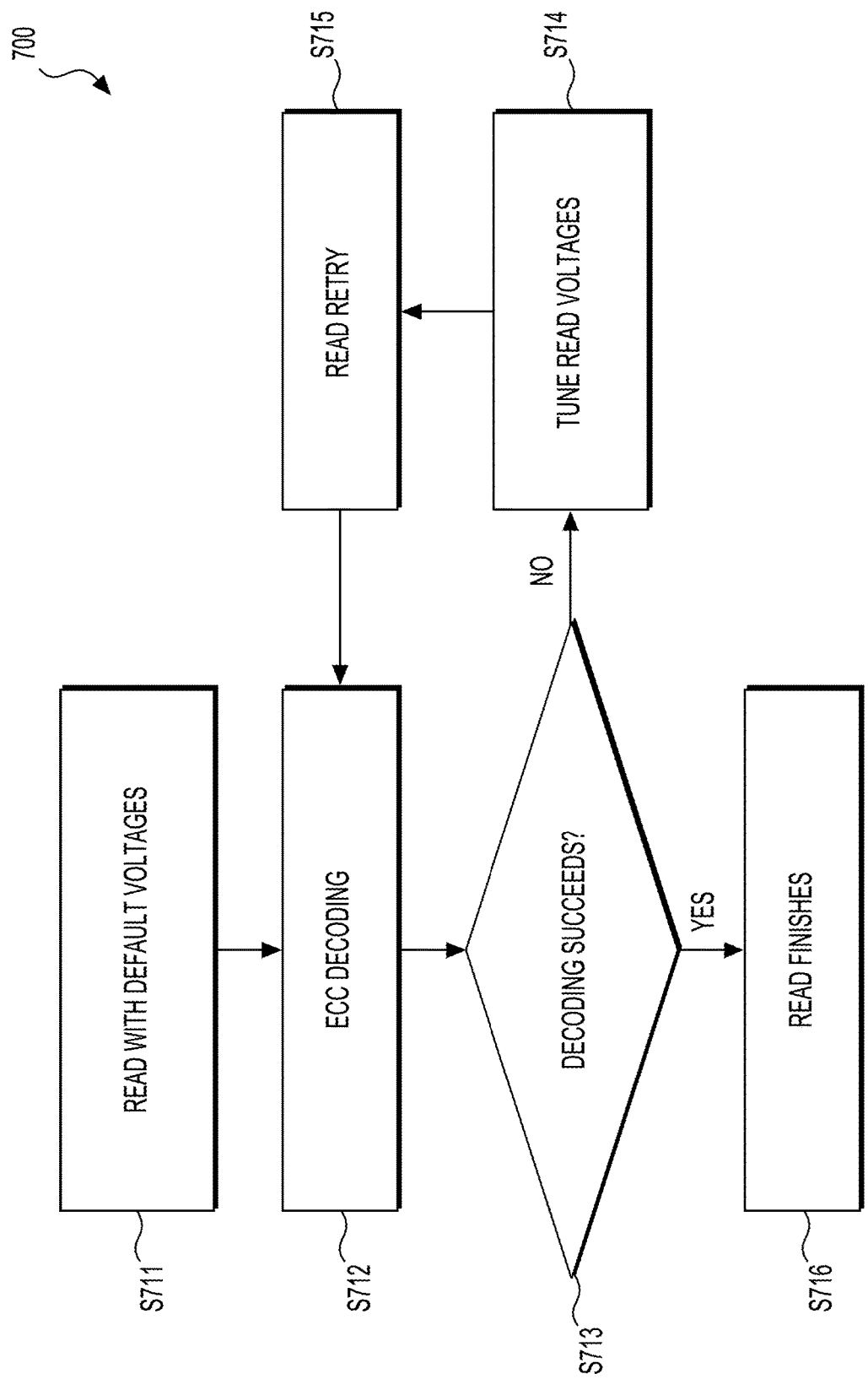
FIG. 7 shows a read process 700 according to embodiments of the disclosure.

FIG. 7 shows a read process 700 according to embodiments of the disclosure. The process 700 can be performed by the memory controller 106 to read data (such as a page or a supper page) from the 3D NAND memory device 104. The process 700 starts from S711.

At S711, a read operation can be performed to retrieve, for example, a page from the memory device 104. The page can be one of a lower page, a middle page, or an upper page stored in a set of TLCs. Accordingly, multiple single-read operations each based on a default read reference voltage can be performed on memory cells storing the page. For example, corresponding to the mapping between the triple bits and the eight states (S0-S7) in FIG. 5, three single-read operations at the default read reference voltages V2, V4, and V6 can be performed for reading a middle page. The bits resulting from each single-read operation can be processed to generate raw bits of code words belonging to the page.

At S712, an ECC decoding can be performed based on the raw bits of the code words. Various types of ECCs (such as low-density parity code (LDPC)) can be used in various embodiments. At S713, whether the ECC decoding succeeds is determined. When an RBER of any code word exceeds the ECC correction capability, the ECC decoding of the page will fail. When the ECC decoding fails, the process 700 proceeds to S714. Otherwise, the process 700 proceeds to S716 and terminates at S716.

At S714, tuning of read reference voltages is performed to determine a new read reference voltage. At S715, a read retry is performed based on the new read reference voltage. The operation at S715 can be similar to that at S711 but with an updated read reference voltage. Based on code word raw bits generated from S715, a second round of ECC decoding can be conducted at S712. The read retry can be repeated until the process 700 reaches S716 or available read reference voltages for read retry are exhausted. "Exhausted" here means all available read reference voltages have been used.

When a read error occurs (at S713), there can be various ways for read error handling in various embodiments. In some examples, a read-retry table is used for a read-retry process. One or more lists of read-retry read reference voltages can be provided in the read-retry table, for example, by a producer of the respective 3D NAND memory device or memory system (such as an SSD). Typically, a read retry table is constructed based on consideration of a limited number of factors, such as retention age, read disturbance, cross temperature, first read issue, and the like. Thus, the read retry table may not be generic for all scenarios.

In some examples, a search method can be used in place of or in addition to the read-retry table. Such type of search method can output a best read reference voltage and thus can be referred to as a best read reference voltage search method or a best read level search method. In various embodiments, various best read reference voltage search methods can be employed. In some examples, a method is triggered in response to a host read request. The best read reference voltage is used as an initial read reference voltage for reading data from the semiconductor memory device.

A best read reference voltage can be used for a read retry or can be used as a base voltage of a soft LDPC decode process. In an example of the soft LDPC decode process, multiple read-retry read reference voltages can be set around the best read reference voltages. Accordingly, multiple read retry operations can be performed (in a step-by-step) manner to obtain Log-likelihood ratios (LLRs). The LLRs can be fed into an ECC engine (that can be separate from or part of the memory controller 106) to soft decode a code word.

In some examples, a search method can be run as a background process. For example, the search method can be performed when the memory controller 106 is idle or can be scheduled at specific times when the memory system 102 has a lower or no workload. The result (a best read reference voltage) can be recorded in a memory. When a default read reference voltage-based read fails or a read-retry table has been exhausted, the controller 106 can retrieve the recorded best read reference voltage to perform another read retry or a soft LDPC decode.

Figure 8:
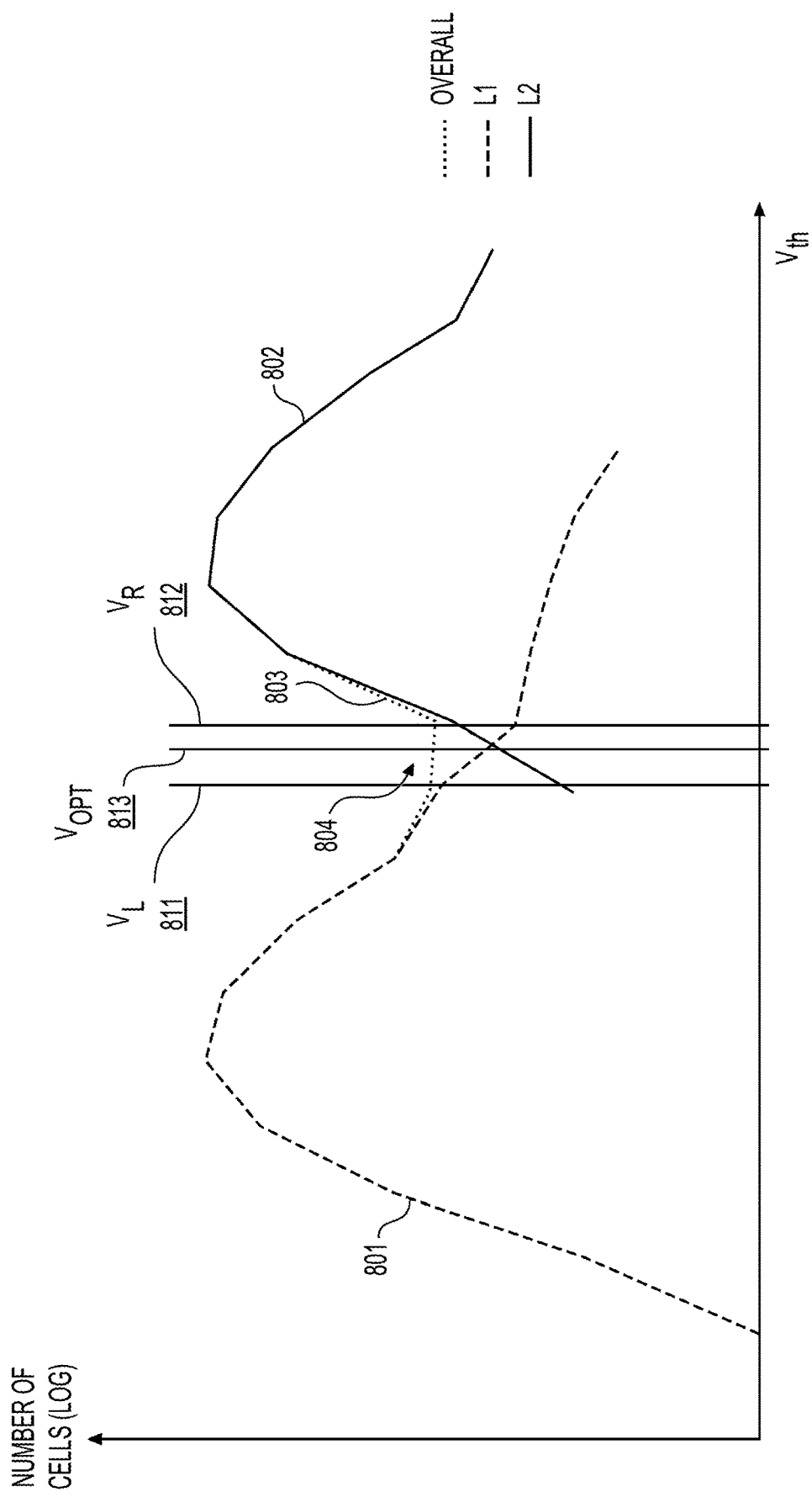
FIG. 8 shows a search method, referred to as valley search, according to embodiments of the disclosure.

FIG. 8 shows a search method, referred to as valley search, according to embodiments of the disclosure. Two memory cell threshold voltage distributions, Distribution 801 and Distribution 802 corresponding to state L1 (S1) and state L2 (S2) of TLCs are shown. An overall memory cell threshold voltage distribution of Distribution 801 and Distribution 802, Distribution 803, is also shown. The Distribution 803 represents a superposition of Distribution 801 and Distribution 802. The horizontal axis represents threshold voltages. The vertical axis represents the numbers of memory cells at respective threshold voltages in a log scale.

The goal of the valley search method is to find a valley bottom 804 of the Distribution 803. The valley bottom 804 corresponds to an optimal read reference voltage 813, denoted $V_{opt}$, on the horizontal axis. For example, from a starting read reference voltage (typically a default read reference voltage between the distributions 801 and 802 of states L1 and L2), with a step voltage value, a scan process can be performed at multiple read reference voltage positions. Slopes of Distribution 803 at different locations may be estimated based on detected bits (ether consider bits 1 or 0) in single-read operations at the multiple read reference voltages. Whether the valley bottom 804 is located to the left or to the right of the starting read reference voltage may be unknown in advance. By evaluation of the slopes (direction and magnitude), a voltage position where slopes do not change can be deemed as the valley bottom 804.

In some scenarios, as shown in FIG. 8, the portion near the valley bottom 804 between a voltage 811 $V_L$ and a voltage 812 $V_R$ may be flat. The voltage 811 or voltage 812 $V_R$ may be incorrectly detected as the optimal voltage 813, $V_{opt}$. To improve the accuracy, in some embodiments, a next round of valley search with a smaller step voltage value can be performed. Delay of the valley search can thus be increased.

Figure 9A:
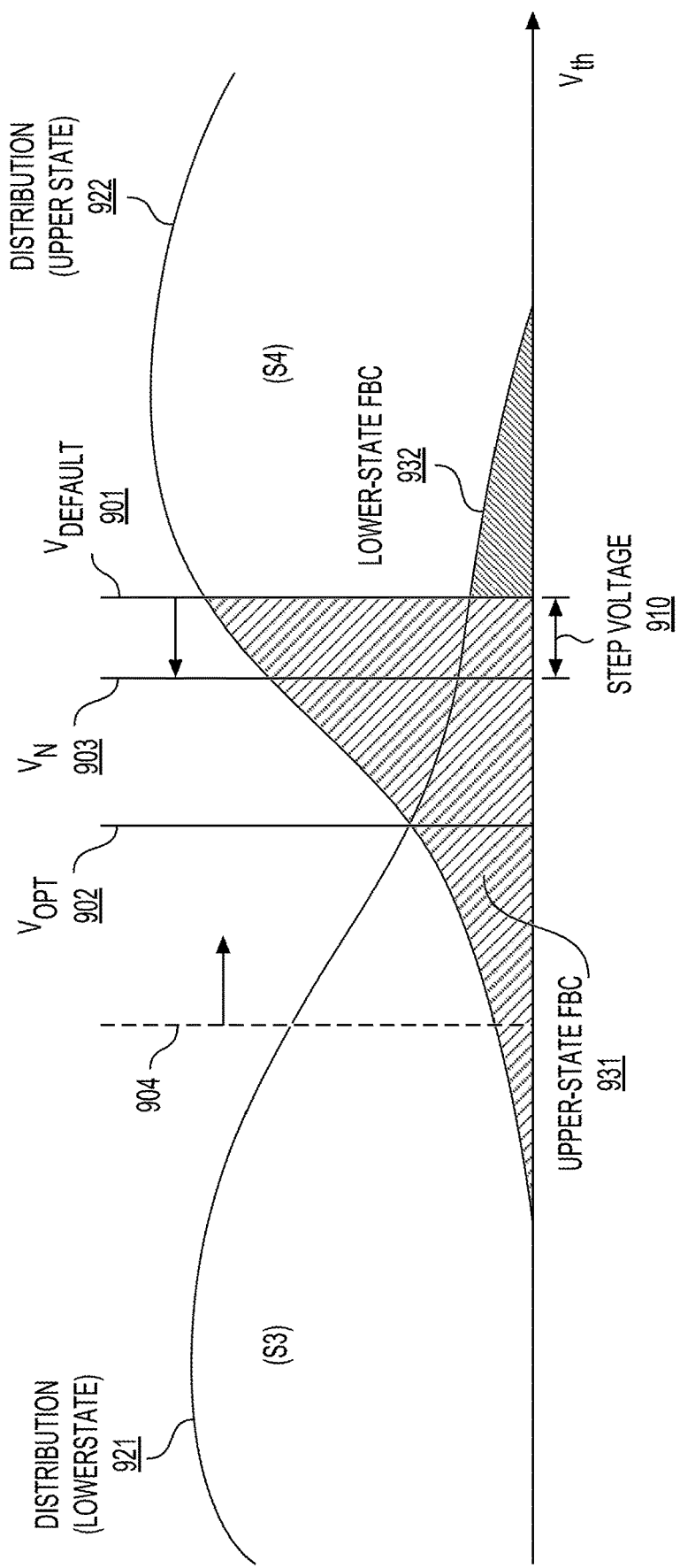
FIG. 9A shows another best read reference voltage search method, referred to as the dummy-data-based search method, according to embodiments in the disclosure.

FIG. 9A shows another best read reference voltage search method, referred to as the dummy-data-based search method, according to embodiments in the disclosure. Typically, when a memory controller performs a page read operation, data to be retrieved from a memory device (such as a 3D NAND memory device) is unknown to the memory controller.

In some scenarios, the memory controller may write some dummy data into the memory device. The location of the dummy data is known to the memory controller. Accordingly, the memory controller can address those locations to obtain a set of detect bits and compare the detected bits with a set of original bits to determine any flipping bits. The original bits can be determined based on the dummy data. A count of these flipping bits, referred to as flipping bit count or failed bit count (FBC) can be used in the dummy-data-based search method In FIG. 9A, two memory cell threshold voltage distributions corresponding to memory cells storing known dummy data are shown: Distribution 921 of a lower state and Distribution 922 of a higher state. For example, the lower state and the upper state can be the states S3 and S4 in the FIG. 5 example, respectively. The memory cells storing the dummy data can be TLCs, and may have threshold voltage distributions corresponding to other states, such as S0, S1, S2, S5, S6, and S7, in FIG. 5. Those distributions exist but are not shown in FIG. 9A.

Distribution 921 and Distribution 922 (and other distributions) have shifted from their original status after a period of retention time since the dummy data is programmed into the memory cells. As shown, Distribution 921 and Distribution 922 cross a respective default read reference voltage 901, denoted $V_{Default}$. An optimal read reference voltage 902, denoted $V_{opt}$, is located at intersections of the curves of the Distributions 921 and 922. Under such a scenario, the dummy-data-based search method can start from an initial voltage point, such as the default read reference voltage 901, and go through a process to scan multiple read reference voltage positions.

Figure 9B:
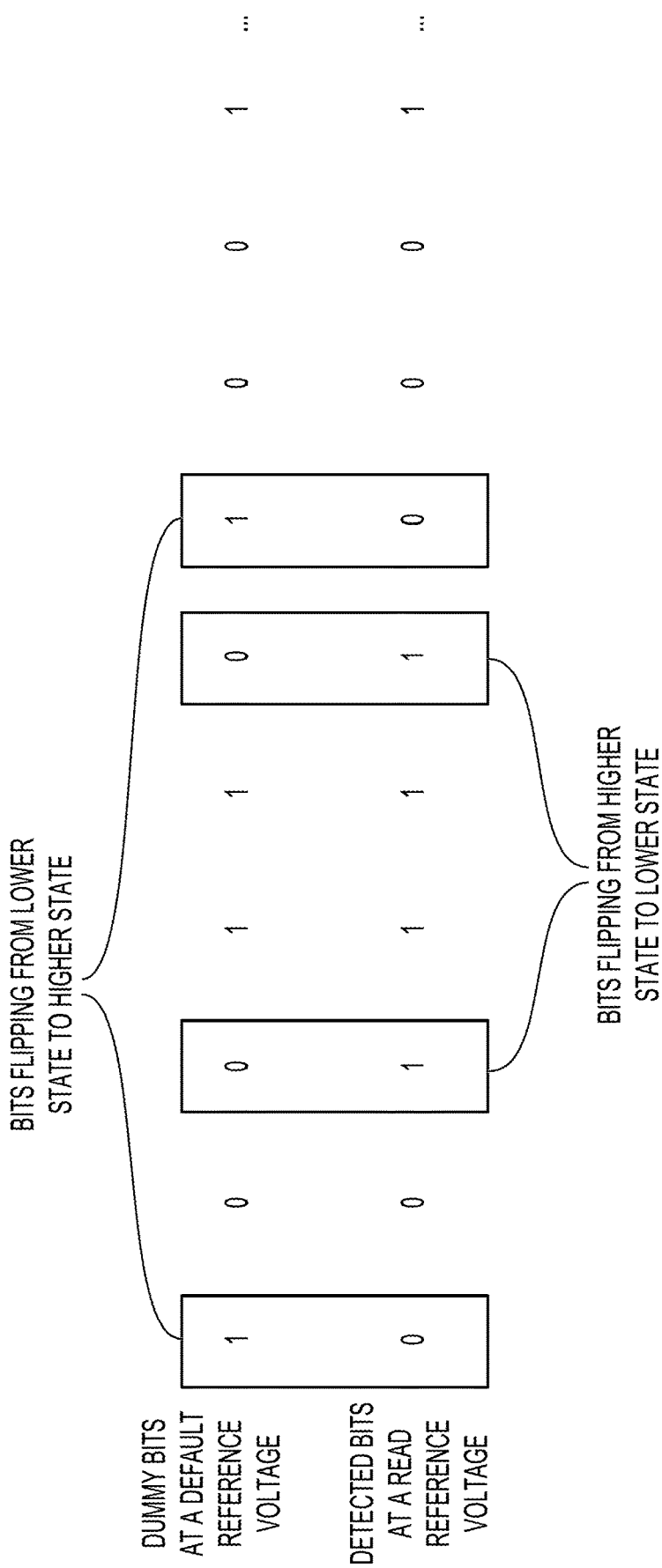
FIG. 9B shows an example of determining the lower-state FBC 932 and the upper-state FBC 931.

Specifically, an initial single-read operation can be performed based on the default read reference voltage 901 to detect flipping bits. Based on the flipping bits, a lower-state FBC 932 and an upper-state FBC 931 can be determined. FIG. 9B shows an example of determining the lower-state FBC 932 and the upper-state FBC 931. A series of original bits determined (or calculated) with respect to the default reference voltage 901 based on the known dummy data is shown in the first row of FIG. 9B. For example, a memory controller (or a periphery circuitry of a memory device) knows the dummy data. Based on the bit values of the dummy data, initial states (threshold voltage levels) of the memory cells when the dummy data is initially programmed in the memory cells can be known (without a reading operation). Given the default reference voltage 901, the original bits with respect to the default reference voltage 901 can be determined.

A series of detected bits with respect to a read reference voltage (the default read reference voltage 901) are shown in the second row of FIG. 9B. For a memory cell having a threshold voltage smaller than the default read reference voltage 901 (the memory cell may be initially programmed to be in one of the states from S0 to S7, for example), a bit value of 1 can be detected. For memory cell having a threshold voltage larger than the default read reference voltage 901, a bit value of 0 can be detected. As shown, the bits flipping from 1 to 0 (or from the lower state to the higher state) can be counted into the lower-state FBC 932, while the bits flipping from 0 to 1 (or from the upper state to the lower state) can be counted into the upper-state FBC 931.

In an embodiment, based on the difference between the lower-state FBC 932 and the upper-state FBC 931, a decision can be made regarding which direction to move with respect to the initial read reference voltage 901 to select a next read reference voltage for a next single-read operation. If the lower-state FBC 932 is smaller than the upper-state FBC 931 and the difference is larger than a threshold, the scan process can move to the left side of the initial read reference voltage 901. If the upper-state FBC 931 is smaller than the lower-state FBC 932 and the difference is larger than the threshold, the scan process can move to the right side of the initial read reference voltage 901.

In the scenario shown in FIG. 9A, the lower-state FBC 932 is smaller than the upper-state FBC 931 by a large difference. Accordingly, the scan process can move to the left side of the initial read reference voltage 901 and to a next read reference voltage 903, denoted $V_N$. The move can be based on a step voltage 910. For example, the next read reference voltage 903 is a step-voltage away from the initial read reference voltage 901.

In some examples, a default read reference voltage is used as the initial point for starting the dummy-data-based search method. The location of an optimal read reference voltage may appear at the right side or the left side of the initial reference voltage depending on the working conditions of the memory system under consideration. Generally, shift directions of memory cell threshold voltage distributions can vary due to different working conditions of the memory cells. Those conditions can include workload types, environmental temperatures, or the like, which can translate into different effects of write/read disturbances, P/E cycles, retention ages, or the like. For example, in the FIG. 9A, it is possible that the default reference voltage 901 is located at the position 904. Accordingly, the optimal read reference voltage 902 appears on the right side of the default reference voltage 901 which is used as the initial read reference voltage at the position 904.

At the next read reference voltage 903, a similar operation as that performed at the initial read reference voltage 901 can be performed to determine a further next read reference voltage. The process at the read reference voltages 901 or 903 can be iterated until a final read reference voltage is found where a respective upper-state FBC and a respective lower-state FBC have a difference smaller than the threshold. At this stage, the final read reference voltage can be output as the best read reference voltage.

In some examples, the step voltage 910 for moving to a next read reference voltage is fixed. Usage of a small fixed step voltage may cause delay at the initial several voltage positions, while usage of a large fixed step may lower the accuracy of the final read reference voltage with respect to the optimal voltage location. In some rare cases, an oscillation around an optimal read reference voltage may happen during a dummy-data-based search process.

In some examples, a dynamic scan-step scheme is employed where the step voltage 910 can be adjusted during the search process. For example, a larger step voltage can be used at the beginning of the search process until the FBC difference (the difference between the upper-state FBC and the lower-state FBC) is smaller than a dynamic scan-step threshold or within a predefined range. Then, a smaller step voltage can be used. In this way, the delay of the respective search process can be reduced while the accuracy of the best read reference voltage can be increased. For example, during the search process, in response to the difference between the upper-state FBC and the lower-state FBC being outside of a predefined range, the read reference voltage is increased or decreased based on a first step voltage. In response to the difference between the upper-state FBC and the lower-state FBC being inside of the predefined range, the read reference voltage is increased or decreased based on a second step voltage smaller than the first step voltage.

FIG. 10 shows examples of dummy data programmed in a memory device according to embodiments of the disclosure. A table 1000 including columns 1001-1006 is provided to show the organization of data programmed in the memory device. The first column 1001 shows string numbers of 6 horizontal memory cell strings. Each such horizontal memory cell string can include a string of memory cells under the control of a horizontal word line, which contrasts with a vertical memory cell string (such as the memory string 308 in the FIG. 3 example) associated with a bit line. The second column 1002 shows page numbers of 18 pages from 0 to 17. Corresponding to TLC configuration, each horizontal memory cell string can store 3 pages (including a lower page, a middle page, and an upper page). Each page can include data of 4 code words 1010 listed in the columns from 1003 to 1006.

In the FIG. 10 example, each code word occupies 4 k bites. The data of these pages can include regular data and dummy data. Regular data can be data received from a host (such as the host 108 in FIG. 1). The code words of regular data can each be associated with a logical block address (LBA), such as the LBAs from LBA-0 to LBA-50. Pages 3-5 each include a code word of dummy data 1020 among the 4 code words stored in each page. Pages 12-14 each include 4 code words of dummy data 1030. Typically, the dummy data includes randomized binary digits having a preconfigured pattern.

In some embodiments, the dummy data corresponding to a horizontal memory string (for example, dummy data 1020 corresponding to String 1) typically can exist in all the pages associated with the horizontal memory string. Based on the known dummy data of these related pages, the original states of the memory cells (belonging to the same horizontal memory cell string and storing the dummy data 1020) can be determined (or calculated). A determined original state of a memory cell storing the dummy data 1020 can be one of the 8 states shown in FIG. 5.

Accordingly, corresponding to a default read reference voltage, among the memory cells storing the dummy data 1020, a first number of memory cells having threshold voltages above the default read reference voltage (i.e., a number of bits 0) can be known based on the dummy data 1020. A second number of memory cells having threshold voltages below the default read reference voltage (i.e., a number of bits 1) can also be known based on the dummy data 1020. These first and second numbers (referred to as original bits) determined based on the known dummy data 1020 can be used as the basis for determining flipping bits during a best read reference voltage search process.

In other examples, corresponding to different MLC techniques employed, a horizontal memory string can store different numbers of pages. For example, for SLCs, one page can be stored. For DLCs, two pages can be stored. For QLC, four pages can be stored. Similarly, based on known dummy data stored in all or a part of a horizontal memory string, original memory cell states can be known. When comparing with a reference voltage, the bits 0 or 1 indicated by these memory cell states can be known and used as a basis for determining flipping bits in a best read reference voltage search process.

In various examples, there can be various reasons for programming dummy data in a memory device. For example, a page is the minimum unit for a write operation in some memory devices. If a to-be-programmed data is less than a page, dummy data can be filled into the page. For example, when programming a supper page that may include pages distributed in different planes on different dies, dummy data can also be used if the data is less than a size of the supper page. In some examples, dummy data is programmed together with regular data for the purpose of improving reliability, such as in the scenario where SSD-based redundant array of independent disks (RAID) techniques are used. Such RAID dummy data can be programed in unit of a page and associated with one or more pages in some examples.

In some examples, dummy data can be purposely programmed for supporting dummy-data-based best read reference voltage search methods disclosed herein. For example, as a result of a fabrication process, there can be specific regions (for examples, blocks or word line groups, or the like) in a memory device that is weak or more vulnerable to incurring flipping bits. A memory controller can be configured to purposely program dummy data in those regions in unit of a code word or a page. A record of these dummy data (physical address, size, bit values, and the like) can be stored in a memory, such that the dummy data can be accessed and used for determining flipping bits.

For another example, when writing data, a memory controller can be configured to write dummy data during the writing process such that dummy data can be mixed with regular data and evenly distributed in programmed regions in a memory device. The address, size, and pattern of these dummy data can be known to a memory controller. For example, information on the dummy data (address, size, bit pattern, or the like) can be stored in a memory. Or, rules for programming dummy data can be predefined. Thus, the dummy data can be accessed and used based on these rules (without relying on the records stored in a memory).

In various examples, dummy data can be accessed in various ways. For a first example, the dummy data 1020 can be used for determining a best read reference voltage for reading a page (such as Page 3, Page 4, or Page 5) containing the dummy data 1020. For a second example, the dummy data 1020 or 1030 can be used for determining a best read reference voltage for reading a corresponding supper page (or a page of the supper page) containing the portion(s) of the dummy data 1020 or 1030. Sometimes, a to-be-read page and the dummy data 1020 or 1030 may belong to a supper page but located in different planes or dies. For a third example, in some cases, a write operation may be performed over a unit of word line group. A word line group can include or be associated with memory cells that are associated with a group of word lines and have similar physical characteristics (e.g., similar cell structures and similar read voltages). When reading a page of word line group including the dummy data 1020 or 1030, the dummy data 1020 or 1030 can be used for determining a best read reference voltage for the page.

In some examples, in response to a failure of an ECC decoding for reading a current page, a memory controller or peripheral circuitry can determine one of: the current page including the dummy data, a neighboring page of the current page including the dummy data, a word line group that includes the current page including the dummy data, and the current page belonging to a super page that includes the dummy data in a plane or a die different from a plane or die of the current page. Accordingly, the memory controller or peripheral circuitry can use the best read voltage as a reference voltage for reading the current page. In some examples, a best read voltage is used as a reference read voltage for one of: reading a code word stored in a same page as the dummy data, reading a page neighboring a page including the dummy data, reading a page belonging to a word line group that includes the dummy data, reading a page that belongs to a same super page as the dummy data and is stored in a plane or die different from a plan or die where the dummy data is stored, In general, when a reading operation of target regular data (e.g., a page or supper page) fails, a memory controller or related peripheral circuitry of a memory device can check if there is dummy data stored nearby. For example, the dummy data may be stored in a same page or a same supper page as the target regular data. For example, the dummy data may be stored on a page that neighbors or one or several pages away from the page storing the target regular data. For example, the dummy data may be stored in a same horizontal memory cell string as the target regular data. For example, the dummy data may be stored in a horizontal memory cell string neighboring a horizontal memory cell string storing the target regular data. The dummy data may be stored in a horizontal memory cell string that is one or more memory cell strings away from a horizontal memory cell string storing the target regular data.

Figure 11:
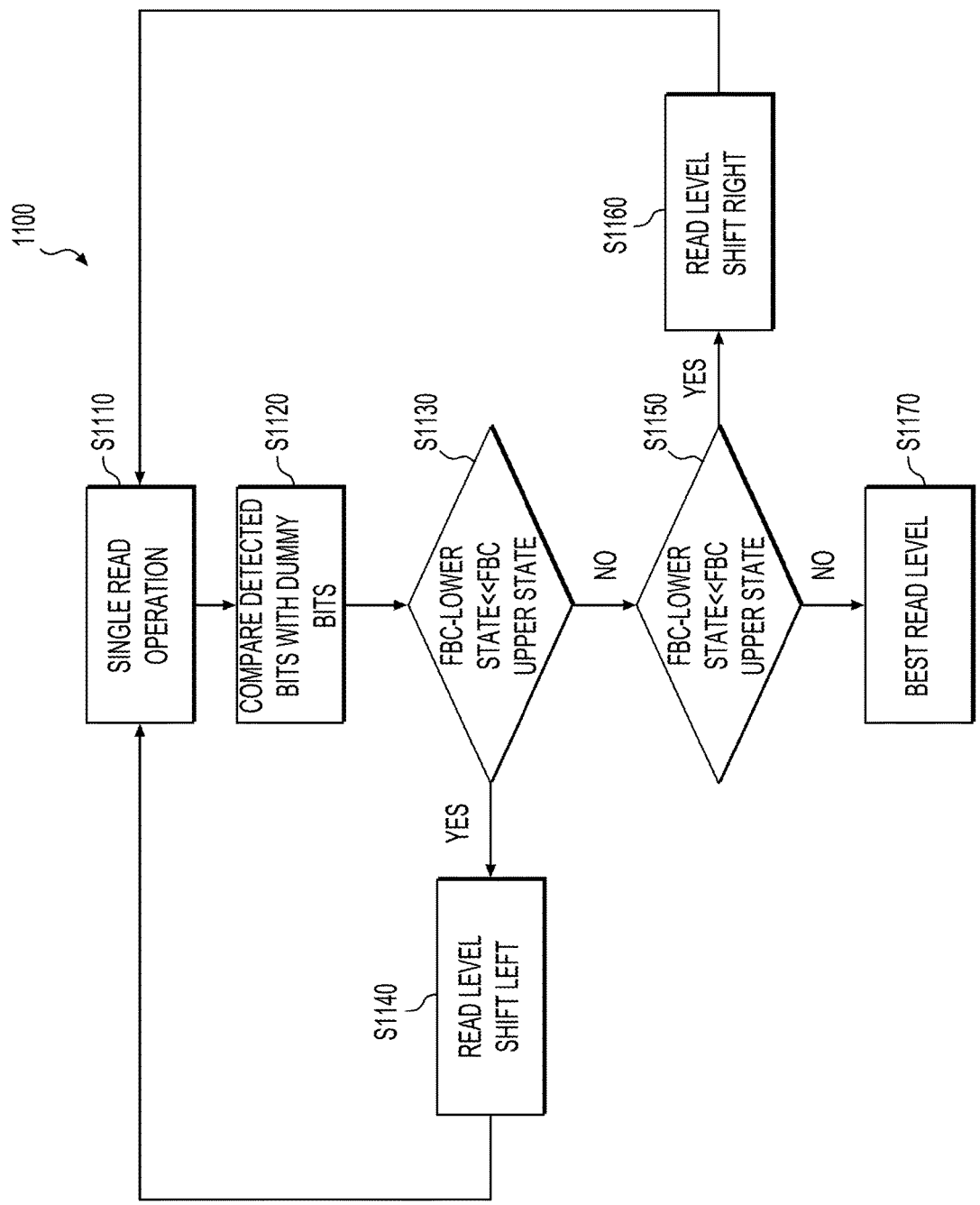
FIG. 11 shows a dummy-data-based best read reference voltage search process 1100 according to embodiments of the disclosure.

FIG. 11 shows a dummy-data-based best read reference voltage search process 1100 according to embodiments of the disclosure. The process 1100 can start from S1110.

At S1110, a single-read operation with a read reference voltage to read from memory cells storing dummy data. For example, an initial ECC decode has failed for reading the middle Page 4 in FIG. 10. Then, the process 1100 can be triggered. For reading Page 4 (which uses TLCs), as shown in the FIG. 5 example, three single-read operations at the default read reference voltages V2, V4, and V6 can be performed. Accordingly, in an example, the process 1100 can be started to first determine a best read reference voltage corresponding to the default read reference voltage V2 (or one of V4 or V6).

For example, a single-read operation can be performed at an initial read reference voltage to read from the horizontal memory cell String 1 at S1110. For example, the default read reference voltage V1 can be used as the initial read reference voltage. Accordingly, a number of detected 1-bits and a number of detected 0-bits with respect to the initial read reference voltage V2 can be determined among the memory cells storing the dummy data 1020 in the horizontal memory cell String 1.

In an example, after a best read reference voltage corresponding to the default read reference voltage V2 is determined, the process 1100 can be repeated to determine best read reference voltages corresponding to V4 and/or V6. Then, these best read reference voltages can together be used for a next read operation for reading Page 4. For example, a soft decode process can be carried out accordingly. In other examples, it is possible that after one or two (not three) best read reference voltages are determined, the one or two best read reference voltages are used in combination with other default reference voltages for a next read operation, for example, for reading page 4.

For TLCs encoded as in the FIG. 5 example, for reading a lower page, two single-read operations at the default read reference voltages V1 and V5 can be performed. For reading an upper page, two single-read operations at the default read reference voltages V3 and V7 can be performed. Corresponding to a lower page or an upper page, the process 1100 can be used to find best read reference voltages corresponding to different sets of default read reference voltages.

In some examples, the process 1100 can be run in background to determine one or more best read reference voltages. For example, corresponding to different MLC techniques, there are different numbers of default read reference voltages. The process 1100 may be performed to find a best read reference voltage corresponding to each default read reference voltage. The results can be stored in a memory.

At S1120, detected bits are compared with dummy bits (original bits of dummy data with respect to a default read reference voltage). At S1110, the number of detected 1-bits and the number of detected 0-bits with respect to the initial read reference voltage are determined among the memory cells storing the dummy data 1020 in the horizontal memory cell String 1. On the other side, based on the known dummy data 1020, a first number of original 1-bits and a second number of original 0-bits with respect to the default reference voltage V2 can be determined among the same set of memory cells. Those detected bits can be compared with the original bits (dummy bits) to determine a lower state FBC of bits flipping from 1 to 0 and a higher state FBC of bits flipping from 0 to 1.

At S1130, it is determined if the lower state FBC is smaller than the higher state FBC and the difference between the lower state FBC and the higher state FBC is larger than a predefined threshold. If so, the process 1100 proceeds to S1140. Otherwise, the process 1100 proceeds to S1150.

At S1140, the level of the read reference voltage is shifted left (reduced) for performing a next round of operations from S1110 to S1130. For example, a step voltage can be predefined. The level of the read reference voltage can be reduced or decreased by the step voltage. Then, the reduced read reference voltage can be used in place of the initial read reference voltage at S1110. The process 1100 can proceed to S1110.

At S1150, it is determined if the lower state FBC is larger than the higher state FBC and the difference between the lower state FBC and the higher state FBC is larger than the predefined threshold. If so, the process 1100 proceeds to S1160. Otherwise, the process 1100 proceeds to S1170.

At S1160, the level of the read reference voltage is shifted right (increased) for performing a next round of operations at S1110-S1130 and S1150. For example, the level of the read reference voltage can be increased by the step voltage. Then, the increased read reference voltage can be used in place of the initial read reference voltage at S1110. The process 1100 can proceed to S1110.

At S1170, a final read reference voltage resulting from S1150 can be determined to be a best read level (a best read reference voltage) corresponding to, for example, the default reference voltage V2. The process S1170 can terminate at S1170.

In some examples, the dynamic scan-step scheme described above is used. A dynamic scan-step threshold can be used to control adjustment of a size the step voltage. The dynamic scan-step threshold can be larger than the predefined threshold used in S1130 or S1150.

In various embodiments, the dummy-data-based methods of determining a best read reference voltage disclosed herein can be implemented at a memory controller (such as the memory controller 106), or at a memory device (such as the memory device 104). These methods can be triggered in response to an ECC decode failure or can be run in background. In some embodiments, the dummy-data-based methods of determining a best read reference voltage can be implemented with hardware, software, or a combination thereof. In an example, a dummy-data-based method of determining a best read reference voltage can be implemented with instructions stored in a non-transitory computer-readable medium. A processor or processing circuitry can execute the instructions to perform the respective method.

Aspects of the disclosure provide a non-transitory computer-readable medium storing instructions that, when executed by a processor, cause the processor to perform a method, the method comprising performing a single-read operation at a read reference voltage of a first level to detect bits from a set of memory cells in a memory device, dummy data being previously programmed into the set of memory cells; determining original bits of the set of memory cells based on a default read reference voltage and known values of the dummy data, the original bits corresponding to initial threshold voltages of the set of memory cells when the dummy data is initially programmed into the set of memory cells; comparing the detected bits and the original bits to determine an upper-state failed bit count (FBC) and a lower-state FBC, the upper-state FBC being a first number of flipping bits that correspond to the memory cells having threshold voltages shifted from above the read reference voltage to below the read reference voltage, the lower-state FBC being a second number of flipping bits that correspond to the memory cells having threshold voltages shifted from below the read reference voltage to above the read reference voltage; and in response to a difference between the upper-state FBC and the lower-state FBC being smaller than a threshold, determining the read reference voltage of the first level to be a best read reference voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a single-read operation at a read reference voltage of a first level to detect bits from a set of memory cells in a memory device, dummy data being previously programmed into the set of memory cells;
determining original bits of the set of memory cells based on a default read reference voltage and known values of the dummy data, the original bits corresponding to initial threshold voltages of the set of memory cells when the dummy data is initially programmed into the set of memory cells;
comparing the detected bits and the original bits to determine an upper-state failed bit count (FBC) and a lower-state FBC, the upper-state FBC being a first number of flipping bits that correspond to the memory cells having threshold voltages shifted from above the read reference voltage to below the read reference voltage, the lower-state FBC being a second number of flipping bits that correspond to the memory cells having threshold voltages shifted from below the read reference voltage to above the read reference voltage; and
in response to a difference between the upper-state FBC and the lower-state FBC being smaller than a threshold, determining the read reference voltage of the first level to be a best read reference voltage.

2. The method of claim 1, further comprising:
in response to the difference between the upper-state FBC and the lower-state FBC being larger than the threshold, and the lower-state FBC being smaller than the upper-state FBC, performing the steps of the performing, the determining, and the comparing using the read reference voltage of a second level smaller than the first level.

3. The method of claim 2, wherein the read reference voltage is increased or decreased based on a fixed step voltage.

4. The method of claim 1, further comprising:
in response to the difference between the upper-state FBC and the lower-state FBC being larger than the threshold, and the lower-state FBC being larger than the upper-state FBC, performing the steps of the performing, the determining, and the comparing using the read reference voltage of a third level larger than the first level.

5. The method of claim 4, wherein the read reference voltage is increased or decreased based on a fixed step voltage.

6. The method of claim 4, wherein in response to the difference between the upper-state FBC and the lower-state FBC being outside of a predefined range, the read reference voltage is increased or decreased based on a first step voltage, and
in response to the difference between the upper-state FBC and the lower-state FBC being inside of the predefined range, the read reference voltage is increased or decreased based on a second step voltage smaller than the first step voltage.

7. The method of claim 1, wherein the method is performed as a background operation.

8. The method of claim 1, wherein the method is triggered in response to a host read request, and the best read reference voltage is used as an initial read reference voltage for reading data from the memory device.

9. The method of claim 1, wherein the method is triggered after an error correction code (ECC) decoding fails.

10. The method of claim 9, further comprising:
using the best read reference voltage as a read-retry voltage for reading data from the memory device, or
using the best read reference voltage as a base voltage for a soft decode process for reading data from the memory device.

11. The method of claim 1, further comprising:
in response to a failure of an ECC decoding for reading a current page, determining one of:
the current page including the dummy data,
a neighboring page of the current page including the dummy data,
a word line group that includes the current page including the dummy data, and
the current page belonging to a super page that includes the dummy data in a plane or a die different from a plane or a die of the current page; and
using the best read voltage as a reference voltage for reading the current page.

12. The method of claim 1, wherein the dummy data is one of:

data of codewords that belong to multiple pages that are stored in a horizontal memory cell string including memory cells associated with a word line, and data of multiple pages that are stored in a horizontal memory cell string including memory cells associated with a word line.

13. The method of claim 1, further comprising:
determining a block in the memory device to be a weak block that is more vulnerable to flipping bit errors than another block in the memory device; and
writing the dummy data to the block.

14. The method of claim 1, further comprising:
using the best read voltage as a reference read voltage for one of:
reading a code word stored in a same page as the dummy data,
reading a page neighboring a page including the dummy data,
reading a page belonging to a word line group that includes the dummy data,
reading a page that belongs to a same super page as the dummy data and is stored in a plane or die different from a plan or die where the dummy data is stored.

15. The method of claim 1, wherein the method is performed by a solid-state drive (SSD) controller.

16. The method of claim 1, wherein the method is performed by circuitry in the memory device.

17. A memory controller, comprising circuitry configured to:
perform a single-read operation at a read reference voltage of a first level to detect bits from a set of memory cells in a memory device, dummy data being previously programmed into the set of memory cells;
determine original bits of the set of memory cells based on a default read reference voltage and known values of the dummy data, the original bits corresponding to initial threshold voltages of the set of memory cells when the dummy data is initially programmed into the set of memory cells;
compare the detected bits and the original bits to determine an upper-state failed bit count (FBC) and a lower-state FBC, the upper-state FBC being a first number of flipping bits that correspond to the memory cells having threshold voltages shifted from above the read reference voltage to below the read reference voltage, the lower-state FBC being a second number of flipping bits that correspond to the memory cells having threshold voltages shifted from below the read reference voltage to above the read reference voltage; and
in response to a difference between the upper-state FBC and the lower-state FBC being smaller than a threshold, determine the read reference voltage of the first level to be a best read reference voltage.

18. The memory controller of claim 17, wherein the circuitry is further configured to:
in response to the difference between the upper-state FBC and the lower-state FBC being larger than the threshold, and the lower-state FBC being smaller than the upper-state FBC, perform the steps of the performing, the determining, and the comparing using the read reference voltage of a second level smaller than the first level.

19. The memory controller of claim 17, wherein the circuitry is further configured to:
in response to the difference between the upper-state FBC and the lower-state FBC being larger than the threshold, and the lower-state FBC being larger than the upper-state FBC, perform the steps of the performing, the determining, and the comparing using the read reference voltage of a third level larger than the first level.

20. A memory system, comprising:
a memory device; and
a memory controller configured to:
perform a single-read operation at a read reference voltage of a first level to detect bits from a set of memory cells in the memory device, dummy data being previously programmed into the set of memory cells;
determine original bits of the set of memory cells based on a default read reference voltage and known values of the dummy data, the original bits corresponding to initial threshold voltages of the set of memory cells when the dummy data is initially programmed into the set of memory cells;
compare the detected bits and the original bits to determine an upper-state failed bit count (FBC) and a lower-state FBC, the upper-state FBC being a first number of flipping bits that correspond to the memory cells having threshold voltages shifted from above the read reference voltage to below the read reference voltage, the lower-state FBC being a second number of flipping bits that correspond to the memory cells having threshold voltages shifted from below the read reference voltage to above the read reference voltage; and
in response to a difference between the upper-state FBC and the lower-state FBC being smaller than a threshold, determine the read reference voltage of the first level to be a best read reference voltage.

* * * * *